United States Patent [19]

Tatsumi et al.

[11] Patent Number: 5,415,922
[45] Date of Patent: May 16, 1995

[54] RESIN-COATED BONDING DEVICE

[75] Inventors: Kohei Tatsumi, Yokohama; Hiroyuki Kondo, Kawasaki; Ryoichi Suzuki, Yokohama; Toru Bando, Hatogaya; Soichi Kadoguchi, Totukahigashi, all of Japan

[73] Assignee: Texas Instruments Incorporated, Dallas, Tex.

[21] Appl. No.: 939,966

[22] Filed: Sep. 4, 1992

Related U.S. Application Data

[63] Continuation of Ser. No. 672,276, Mar. 20, 1991, abandoned.

Foreign Application Priority Data

Mar. 23, 1990 [JP] Japan ................... 2-74151

[51] Int. Cl.$^6$ .......................... C22C 5/02; D02G 3/00
[52] U.S. Cl. .................... 428/220; 428/373; 428/374; 428/375; 428/398; 428/606; 420/507; 420/511; 420/508; 420/509
[58] Field of Search ............... 428/373, 374, 375, 398, 428/606, 220; 420/507, 511

[56] References Cited

U.S. PATENT DOCUMENTS 4,860,941  8/1989  Otto .................................. 228/179

FOREIGN PATENT DOCUMENTS 583239     1/1983   Japan .
59-087702  5/1984   Japan .

*Primary Examiner*—Patrick J. Ryan
*Assistant Examiner*—Richard C. Weisberger
*Attorney, Agent, or Firm*—Richard L. Donaldson; William E. Hiller

[57] ABSTRACT

A resin-coated, bonding fine wire for use in forming bonded electrical connections on a semiconductor device, wherein the wire is characterized as having a tensile strength exceeded when the wire is further elongated in length in a range of 0.5% to 3.5% of its original length by breaking of the wire during tension testing. It has been determined that an insulated bonding fine wire exhibiting such relatively low ductility produces a loop profile maintainable in a stable condition during a bonding operation while providing reliable bonding strength.

8 Claims, 1 Drawing Sheet

RESIN-COATED BONDING DEVICE

This application is a Continuation of application Ser. No. 672,276, filed Mar. 20, 1991, now abandoned.

DETAILED DESCRIPTION OF THE INVENTION

1. Industrial Field

This invention relates to a bonding fine-wire for semiconductor covered over the surface thereof with an insulating film.

2. Prior Art

A bonding fine-wire is pulled out of a capillary, and its leading end is heated to be formed into a molten ball. The ball is forced down onto a semiconductor element to make the first bonding. Then as the capillary is moved, the fine-wire is pulled out to be profiled into a specified loop until it reaches the lead surface and there stitch bonding (the second bonding) is carried out.

For bonding fine-wire, naked gold wire usually 20 to 50 $\mu$m in diameter is broadly used. Sometimes the loop between the first and second bonds is loosened, which may result in happening of touch of the fine-wire to the semiconductor element, accompanied by short circuit. Particularly recently with developing very large scale IC and in cooperation with miniaturization of elements themselves, there is progress to high-density multi-pin connection structure. Such multi-pin connection leads to longer connection span of fine-wire and wider use of finer wires. These make it easier for touch between the adjacent fine-wires due to sagging and curling of the loop to be induced.

As countermeasure against high density fine-wires as above-mentioned, that is, for preventing short circuits between bonding fine-wires or between fine-wires and semiconductor elements, therefore bonding fine-wires covered over the surface thereof with an insulating film are disclosed, for example, in Japanese Patent Laid-Open Application Nos. Sho.58-3239 and 59-154054.

PROBLEM TO BE SOLVED BY THE INVENTION

Insulating coating-covered bonding fine-wire has the corresponding effect of preventing short circuit caused by touch. Generally-used conventional insulating coating-covered bonding fine-wires of gold can be profiled only into unstable bonding loop, and thus have presented problems with reliability. Further there is problem with regard to bonding property that the bonding strength at the second bond is low compared with uncoated gold wire, so that continuous bonding operation is interrupted frequently.

The present invention is to solve these problems, to keep the loop profile stable during bonding operation, and to provide a resin-coated bonding fine-wire with an improved bonding property.

MEANS FOR SOLVING THE PROBLEM

The present inventors have found from high speed video taken during high-speed bonding of fine wires and the observation results of tearing flaw of coating materials with a scanning electronic microscopy that the cause for occurrence of abnormal loop profile of the resin-coated bonding fine-wire is great friction at sliding in the inside of the capillary compared with the conventional uncoated gold wire, and therefore the loop can-not be held stable when the resin coated bonding wire is pulled in and out the end of the capillary.

That is, for improving the slidability between the bonding fine-wire and the capillary, it is one effective method to lower roughness of the inside surface of the capillary, which is of very minute texture and also made of ceramics restrictive from the viewpoint of material, there exists a limitation for the improvement. Accordingly an attempt to improve the concerned respect of problem above-mentioned was made by changing the conditions under which the bonding fine-wire slides through the inside of the capillary when moved. In other words, it has been demonstrated effective to change the strength and ductility of the gold wire and particularly much so to lower the ductility of the gold wire.

The present invention has been completed based on such knowledge, and the subject-matter is that in a bonding fine-wire for semiconductor wherein a gold fine-wire is covered over the surface thereof with an insulating film of a high molecular material, the elongation of the fine-wire reaching to a rupture point at tension test is not less than 0.5% and not more than 3.5%.

The present invention will be described in detail hereinafter.

In general a gold wire is doped with very small amounts of elements in melting step to obtain an intended characteristics, and is manufactured via stretching and heating steps. Usually the wires which have 20 to 50 $\mu$m in diameter are used and its elongation reaching to a rupture point at tension test is adjusted to about 4 to 10%. This elongation which is the value finally adjusted by heating treatment was set experientially based on bonding strength and looping characteristics, and others.

On the other hand, a resin-coated bonding fine-wire having the same elongation as in the prior art has a poor bonding property. Particularly frequency of defective bonding increases in regard to the second bonding. Besides deviated loop profile becomes found, and there has been problem with stability. In other words, various tests were carried out with the assumption that the loop formation of double-layer fine-wires and resin peeling off caused by the compressive second bonding are correlated to fine-wire material. From the results it has been revealed that elongation reaching to the broken point at tension test should be controlled to be smaller compared with normal value of the naked fine-wire, with the effect of attaining good looping characteristics and improved bonding property.

The reason that in the present invention the elongation reaching to a rupture point at tension test is set at no less than 0.5% and no more than 3.5% is from the viewpoint like this. The elongation of the resin-coated bonding fine-wire controlled to be no more than 3.5% results in more easily breaking the resin coating layer on the second compressive bonding, which enables the bonding between gold wire and metal on the lead surface. Thus remarkable improvement in bonding property can be attained. Elongations exceeding 4% could effect unremarkably on looping characteristics and bonding property. In elongations of up to 0.5%, the residual internal strain of the gold wire resulting from stretching results in an abnormal shape such as curve of the fine-wire which is not desirable to use. The most appropriate range of the elongation is within a range 1% to 3%. Besides in the present invention, the elongation can be adjusted within the above-mentioned range, for example, by changing temperature or time of annealing after elongating.

EMBODIMENTS

Gold wires of 99.99% in purity and about 30 μmφ which have a resin (polyarylate) coated with 0.8 μm of thickness, and having various elongations (% when a rupture occurs at tension test) listed in Table 1 were subjected to bonding test along with evaluation of looping characteristics.

Figure 1A:
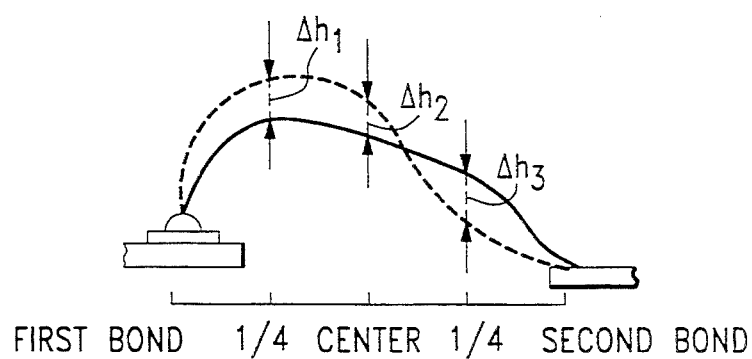
FIG. 1 illustrates the loop profiles of a resin-coated bonding wire. (A) and (B) are side and top views of the loop profile, respectively.
Figure 1B:
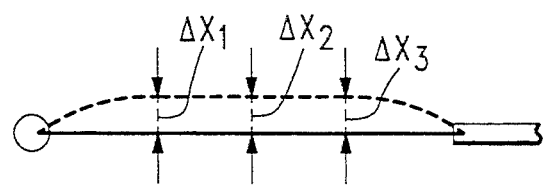

At wire bondng operation, first bonding was carried out on the chip as a ball bonding, and second bonding was carried ou on a lead as a stitch bonding. After carrying out above bonding operation, the looping characteristic was evaluated by means of a deviation of gold wire loop profile. That is, as shown in FIG. 1A (side loop profile of the resin-coated gold wire) and FIG. 1B (top loop profile of the same gold wire), in various positions: ¼ from the first bond, center and ¼ from the second bond of the loop span (distance between the first and second bonds), differences in vertical direction ($\Delta h_1$ through $\Delta h_3$) and in horizontal direction ($\Delta x_1$ through $\Delta x_3$) between average loop profile (solid line) and deviated loop profile (broken line) were measured. If difference of 100 μm or more is observed at least one out of 100 pins, X was marked.

For a bondability evaluation, the specimen which enabled more than continuous 6000 bondings is indicated by "○", the specimen which enabled 100 or more but less than 6000 bondings is indicated by "Δ", and the specimen which enabled up to 100 bondings is indicated by "X". Bonding strength was indicated by $f(g)/f_o$ (f: coated wire and $f_o$: uncoated wire) of average pull test values with them (resin-coated gold wire and uncoated naked gold wire).

The measured results are shown in Table 1. In this Table, for comparison, those of no resin-coated gold wire are conjunctly given. Besides in all the cases shown in Table 1, no defective first bonding was observed. Besides it was observed that no bonding failure caused by the removal of the ball in pull test.

The span, distance between the first and second bondings, was 3 mm.

EFFECT OF THE INVENTION

As described above, the resin-coated bonding fine-wire has its elongation within a range 0.5% to 3.5% inclusive, and consequently is good in looping characteristic and bonding property, thus having enabled fabrication of high-yield, reliable semiconductor devices.

We claim:

1. A composite bonding wire for use in forming bonded electrical connections on a semiconductor device, said composite bonding wire comprising:
   an elongated fine wire of electrically conductive material and having a diameter in the range of 20–50 μm; and
   an insulating layer coating said elongated fine wire of electrically conductive material;
   said elongated fine wire of electrically conductive material of said composite bonding wire exhibiting relatively low ductility in being characterized as having the property of breaking due to tensile stress causing the tensile strength of said fine wire to be exceeded in response to stretching of said elongated fine wire during tensile testing so as to increase the original length of said elongated fine wire in a range of 0.5% to 3.5% of its original length, such that the loop profile of said composite bonding wire can be maintained in a stable condition during a bonding operation.

2. A composite bonding wire as set forth in claim 1, wherein said fine wire of electrically conductive material is gold.

3. A composite bonding wire as set forth in claim 2, wherein said insulating layer is a resin.

4. A composite bonding wire as set forth in claim 3, wherein said resin is polyarylate.

5. A composite bonding wire as set forth in claim 3, wherein the thickness of said resin is approximately 0.8 μm.

6. A composite bonding wire as set forth in claim 2, wherein the diameter of said gold wire is of the order of 30 μm.

7. A composite bonding wire as set forth in claim 1, wherein said elongated fine wire is further characterized as having the property of breaking due to tensile stress causing the tensile strength of said fine wire to be exceeded in response to stretching of said elongated fine wire during tensile testing so as to increase the original length of said elongated fine wire in a range of 1.0% to 3.0% of its original length.

8. A composite bonding wire as set forth in claim 5, wherein the diameter of said gold wire is of the order of 30 μm.

TABLE 1

| Sample No. | Elongation of fine-wire (%) | Looping Characteristics | Ability to be succesively bonded | Wire Bonding Strength $f/f_o$ | Wire diameter |
|---|---|---|---|---|---|
| 1 (Reference) | 0.2 | X | Δ | 0.6 | 30 |
| 2 (Invention) | 0.5 | ○ | ○ | 0.80 | 30 |
| 3 (Invention) | 1.0 | ○ | ○ | 0.85 | 30 |
| 4 (Invention) | 1.8 | ○ | ○ | 0.85 | 25 |
| 5 (Invention) | 2.9 | ○ | ○ | 0.85 | 30 |
| 6 (Invention) | 3.0 | ○ | ○ | 0.85 | 33 |
| 7 (Invention) | 3.5 | ○ | Δ | 0.75 | 30 |
| 8 (Reference) | 4.2 | X | Δ | 0.7 | 30 |
| 9 (Reference) | 6.5 | X | Δ | 0.65 | 30 |
| 10 (Reference) | 8.0 | X | Δ | 0.65 | 30 |
| 11 (uncoated) | 2.0 | ○ | ○ | 1 | 30 |
| 12 (uncoated) | 4.0 | ○ | ○ | 1 | 30 |
| 13 (uncoated) | 8.0 | ○ | ○ | 1 | 30 |

(Note) Resin-coating thickness of Nos. 1–10: 0.8 μm

As apparent from the aforesaid Table, any coated bonding fine-wire having an elongation within a range 0.5% to 3.5% inclusive which is the range according to the present invention gives good results.